United States Patent
Johansson et al.

(10) Patent No.: US 6,879,611 B1
(45) Date of Patent: Apr. 12, 2005

(54) VCSEL WITH MONITOR EMISSION THROUGH HIGH REFLECTIVITY MIRROR

(75) Inventors: Claes Johansson, Kista (SE); Rickard Marcks von Würtemberg, Stockholm (SE)

(73) Assignee: Zarlink Semiconductor AB, Jarfalla (SE)

( * ) Notice: Subject to any disclaimer, the term of this patent is extended or adjusted under 35 U.S.C. 154(b) by 0 days.

(21) Appl. No.: 09/438,955

(22) Filed: Nov. 12, 1999

(30) Foreign Application Priority Data

Jan. 30, 1999 (GB) .............................. 9901985

(51) Int. Cl.$^7$ ................................ H01S 5/00
(52) U.S. Cl. ............................ 372/45; 372/43; 372/50
(58) Field of Search ............................ 372/50, 92, 43, 372/45

(56) References Cited

U.S. PATENT DOCUMENTS

| | | | |
|---|---|---|---|
| 5,136,603 A | | 8/1992 | Hasnain et al. |
| 5,266,503 A | | 11/1993 | Wang et al. |
| 5,287,367 A | * | 2/1994 | Yanagawa ............ 372/31 |
| 5,317,587 A | | 5/1994 | Ackley et al. |
| 5,706,117 A | * | 1/1998 | Imai et al. ............ 398/197 |
| 5,724,376 A | * | 3/1998 | Kish et al. ............ 372/36 |
| 5,751,757 A | * | 5/1998 | Jiang et al. ............ 372/50 |
| 5,838,708 A | * | 11/1998 | Lin et al. ............ 372/50 |

FOREIGN PATENT DOCUMENTS

| | | |
|---|---|---|
| EP | 0 803 943 A2 | 4/1997 |
| GB | 2 295 269 A | 5/1996 |
| GB | 2 307 791 A | 6/1997 |
| WO | WO 95/14520 A1 | 1/1992 |
| WO | WO 95/26051 A1 | 3/1994 |
| WO | WO 95/26051 | 9/1995 |

OTHER PUBLICATIONS

"Optically transparent indium–tin–oxide (ITO) ohmic contacts in the fabrication of vertical–cavity surface–emitting lasers", M.A. Martin et al., Electronics Letters, 17th Feb., 1994, vol. 30, No. 4, pp. 318–320.

* cited by examiner

Primary Examiner—Don Wong
Assistant Examiner—Cornelius H. Jackson
(74) Attorney, Agent, or Firm—Lawrence E. Laubscher, Jr.

(57) ABSTRACT

A bottom emitting VCSEL where the light emitted can be monitored without obstruction. No additional mountings are required, such as a header, to monitor output, which mountings are necessary in prior art arrangements.

8 Claims, 1 Drawing Sheet

VCSEL WITH MONITOR EMISSION THROUGH HIGH REFLECTIVITY MIRROR

FIELD OF THE INVENTION

The present invention relates to a method of monitoring the light output from a VCSEL and more particularly, the present invention relates to a method of monitoring the light emission from a VCSEL without interfering with the light output from the VCSEL.

BACKGROUND OF THE INVENTION

Previously, when mounted in a header, light that was reflected from the top lens of the VCSEL back into the header was monitored with a Si photodiode, on which the VCSEL chip was mounted. Presently, the art has not recognized any method of monitoring the light from a VCSEL chip that is not mounted in a header. The use of a header is required in existing systems to monitor light emission.

In many applications it is desirable to know for certain that the VCSEL is in fact emitting light upon current being driven through it. The problem is to monitor this light without disturbing the lightbeam too much, and to conduct this in an affordable manner that does not require complex packaging.

The present invention provides methodology to monitor the light emission from a VCSEL without in any way obstructing and/or disturbing the output light. It also eliminates the need of mounting the VCSEL chip in a header just to monitor its output light.

SUMMARY OF THE INVENTION

One object of one embodiment of the present invention is to provide a surface emitting laser, comprising:

a plurality of spaced apart mirrors;

a light amplifying region between the mirrors;

a substrate; and a photon transparent ohmic contact for passing light energy therethrough whereby light emission through the surface emitting laser may be monitored.

A further object of one embodiment of the present invention is to provide a method for monitoring light emission from a surface emitting laser, the laser including:

a plurality of spaced apart mirrors;

a light amplifying region between the mirrors;

a substrate;

a photon transparent ohmic contact;

contacting the laser with a source of energy to generate light; and monitoring emitted light transmitted through the transparent ohmic contact.

Having thus generally described the invention reference will now be made to the accompanying drawings illustrating preferred embodiments.

DETAILED DESCRIPTION OF THE PREFERRED EMBODIMENTS

Figure 1:
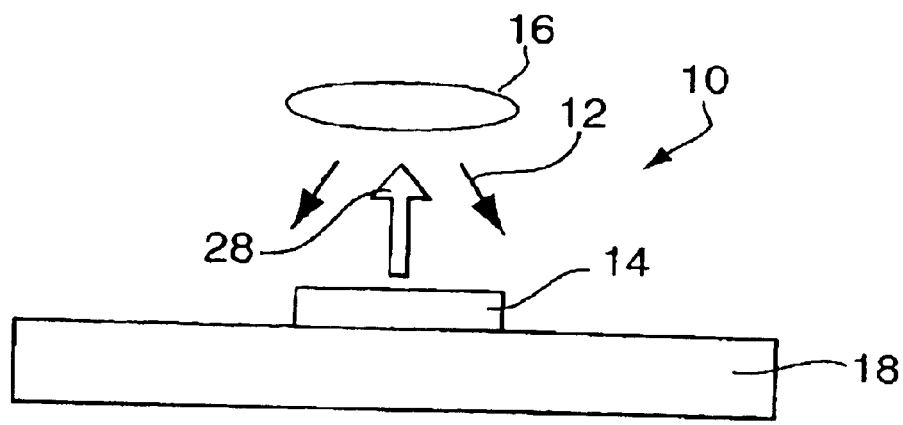
FIG. 1 is a schematic illustration of the prior art arrangement for monitoring light output.

Similar elements employed in the drawings denote similar elements.

Referring now to the drawings, FIG. 1 depicts a conventional arrangement, generally denoted by numeral 10, for monitoring light 12 emitted from a VCSEL 14. The light 12 reflected from top lens 16 and on to photo diode 18. In this embodiment, the light is detectable only by the photo diode and as such, the arrangement is limited as discussed hereinabove.

Figure 2:
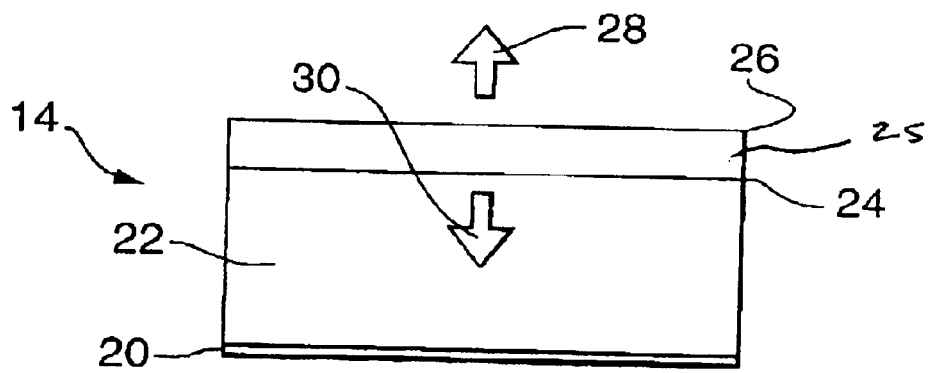
FIG. 2 is a schematic illustration of a standard VCSEL showing the loss of light to the substrate.

In FIG. 2, a standard VCSEL is illustrated having an ohmic contact 20, a substrate 22 and a stack consisting of reflective mirrors, the high reflectivity mirror being denoted by the reference numeral 24 and the low reflectivity mirror being denoted by the reference numeral 26. Between the reflective mirrors is a light amplifying region 25.

As is known with VCSELs, one of the mirrors reflects less (and transmits more) of the incident light from the amplifying region 25. The light transmitted through this less reflecting mirror is the light constituting the output light emitted by the VCSEL. This light is shown in FIG. 1 by the arrow indicated by numeral 28.

In the standard top-emitting VCSEL illustrated in FIG. 2, light denoted by arrow 30 is lost as it is emitted into the substrate 22 below the bottom (high reflectivity) mirror 24 if it is not of a wavelength to which the substrate is transparent.

Figure 3:
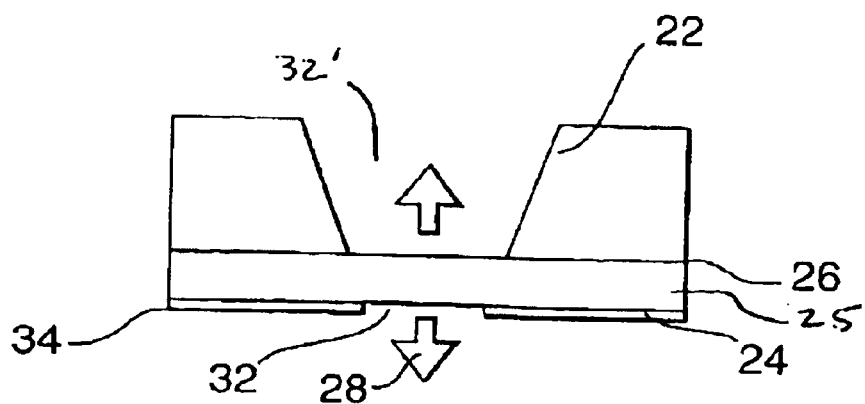
FIG. 3 is a schematic illustration of one embodiment of the present invention.

However, in a bottom emitting VCSEL, shown in FIG. 3, where the light emitted through the less reflecting mirror 26 passes through a hole 32 forming a light output port in the substrate 22, nothing stops the light 28 that is transmitted through the high reflectivity mirror 24, except the ohmic contact 34 that is placed on the other side of that mirror. By providing an aperture 32 in the ohmic contact 34, it is possible to extract that light and monitor it with a photodiode (not shown) on which the VCSEL chip 14 can be placed Generally speaking, a photon transparent contact is one that allows light emission through it via an aperture or is made of a transparent material. Further, the contact may be made sufficiently thin to allow passage of light or the contact may incorporate a combination of these features.

In a further aspect of the invention, the same can be used for any bottom-emitting VCSEL, including those that have wavelengths for which the substrate is transparent. Where the substrate is transparent, no aperture has to be made through the substrate in order to allow primary (i.e. not the monitor) light to be extracted from the VCSEL structure. For such VCSELs, the standard VCSEL design allows the monitor light to be extracted through the substrate, making bottom emission of the primary light unnecessary. To extract the monitor light through the ohmic contact (for both standard and bottom emitting VCSELs), it is not necessary to make an aperture in the contact. Instead, the contact may be made out of a photon transparent material (for example, but not limited to, ITO (Indium Tin Oxide)), or the contact can be made sufficiently thin to allow light to pass through it. In this regard, the contact may have a thickness of between 1 nm (nanometer) and 100 nm.

Although embodiments of the invention have been described above, it is not limited thereto and it will be apparent to those skilled in the art that numerous modifications form part of the present invention insofar as they do not depart from the spirit, nature and scope of the claimed and described invention.

What is claimed is:

1. A bottom-emitting vertical cavity surface emitting laser, comprising:

a substrate permitting the passage of light therethrough.

a laser stack consisting essentially of a high reflectivity mirror, a low reflectivity mirror; and an active light-amplifying region located between said high and low reflectivity mirrors, said laser stack being provided on said substrate with said low reflectivity mirror adjacent said substrate;

a light output port located in said substrate adjacent said low reflectivity mirror for transmitting light emitted by said active light-amplifying region and constituting an output of said laser; and an ohmic contact provided on said high reflectivity mirror, said ohmic contact being photon transparent for transmitting some of said light emitted by said light-amplifying region that passes through said high reflectivity mirror for monitoring with an external photodetector.

2. A surface emitting cavity laser as claimed in claim 1, wherein said ohmic contact is made of a photon transparent material.

3. A surface emitting cavity laser as claimed in claim 2, wherein said photon transparent material comprises Indium Tin Oxide.

4. A surface emitting cavity laser as claimed in claim 1, wherein said ohmic contact contains an aperture to pass light there through.

5. A surface emitting cavity laser as claimed in claim 1, wherein said ohmic contact has a thickness between 1 and 100 nm.

6. A surface emitting cavity laser as claimed in claim 1, wherein, said output port is provided by a hole in said substrate.

7. A surface emitting cavity laser as claimed in claim 6, wherein said ohmic contact is made of a photon transparent material.

8. A surface emitting cavity laser as claimed in claim 7, wherein said photon transparent material comprises Indium Tin Oxide.

* * * * *